US008492245B1

(12) United States Patent
Lagally et al.

(10) Patent No.: US 8,492,245 B1
(45) Date of Patent: Jul. 23, 2013

(54) METHODS FOR MAKING THIN LAYERS OF CRYSTALLINE MATERIALS

(75) Inventors: Max G. Lagally, Madison, WI (US); Deborah M. Paskiewicz, Oregon, WI (US); Boy Tanto, Hillsboro, OR (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 13/367,600

(22) Filed: Feb. 7, 2012

(51) Int. Cl.
*H01L 21/30* (2006.01)

(52) U.S. Cl.
USPC .... 438/458; 438/479; 438/507; 257/E21.093; 257/E21.102

(58) Field of Classification Search
None
See application file for complete search history.

(56) References Cited

U.S. PATENT DOCUMENTS

| | | | |
|---|---|---|---|
| 4,846,931 A | 7/1989 | Gmitter et al. | |
| 7,229,901 B2 | 6/2007 | Savage et al. | |
| 7,354,809 B2 | 4/2008 | Yuan et al. | |
| 2011/0193195 A1* | 8/2011 | Atwater et al. | 257/615 |

FOREIGN PATENT DOCUMENTS

WO   WO 2005/122285 A2   12/2005

OTHER PUBLICATIONS

Qin et al., Formation of microtubes from strained SiGe/Si heterostructures, New Journal of Physics, vol. 7, No. 241, Nov. 29, 2005.

Rogers et al., A printable form of silicon for high performance thin film transistors on plastic substrates, Applied Physics Letters, vol. 84, No. 26, Jun. 17, 2004, pp. 5398-5400.

Damlencourt et al., Paramorphic Growth: A New Approach in Mismatched Heteroepitaxy to Prepare Fully Relaxed Materials, Japanese Journal of Applied Physics, vol. 38, Sep. 15, 1999, pp. L996-L999.

Damlencourt et al., High-quality fully relaxed $In_{0.65}Ga_{0.35}As$ layers grown on InP using the paramorphic approach, Applied Physics Letters, vol. 75, No. 23, Dec. 6, 1999, pp. 3638-3640.

Jones et al., Long-wavelength InGaAs quantum wells grown without strain-induced warping on InGaAs compliant membranes above a GaAs substrate, Applied Physics Letters, vol. 74, No. 7, Feb. 15, 1999, pp. 1000-1002.

Cohen et al., Free standing silicon as a compliant substrate for SiGe, Mat. Res. Soc. Symp. Proc., vol. 765, 2003, pp. D4.6.1/G1.6.1-D4.6.6/G1.6.6.

Mooney et al., Elastic strain relaxation in free-standing SiGe/Si structures, Applied Physics Letters, vol. 84, No. 7, Feb. 16, 2004, pp. 1093-1095.

Mooney et al., Strained Si-on-Insulator Fabricated from Elastically-Relaxed Si/SiGe Structures, Mat. Res. Soc. Symp. Proc., vol. 809, 2004, pp. B1.3.1-B1.3.6.

Lo, New approach to grow pseudomorphic structures over the critical thickness, Applied Physics Letters, vol. 59, No. 18, Oct. 28, 1991, pp. 2311-2313.

(Continued)

*Primary Examiner* — Julio J Maldonado
*Assistant Examiner* — Joseph Galvin, III
(74) *Attorney, Agent, or Firm* — Bell & Manning, LLC

(57) ABSTRACT

Methods for making growth templates for the epitaxial growth of compound semiconductors and other materials are provided. The growth templates are thin layers of single-crystalline materials that are themselves grown epitaxially on a substrate that includes a thin layer of sacrificial material. The thin layer of sacrificial material, which creates a coherent strain in the single-crystalline material as it is grown thereon, includes one or more suspended sections and one or more supported sections.

18 Claims, 10 Drawing Sheets

(a)

(b)

OTHER PUBLICATIONS

Ejeckam et al., Lattice engineered compliant substrate for defect-free heteroepitaxial growth, Applied Physics Letters, vol. 70, No. 13, Mar. 31, 1997, pp. 1685-1687.

Boudaa et al., Growth and Characterization of Totally Relaxed InGaAs Thick Layers on Strain-Relaxed Paramorphic InP Substrates, Journal of Electronic Materials, vol. 33, No. 7, Jul. 2004, pp. 833-839.

Leite et al., Wafer-Scale Strain Engineering of Ultrathin Semiconductor Crystalline Layers, Advanced Materials, vol. 23, No. 33, Jul. 19, 2011, pp. 1-7.

Yuan et al., Flexible photodetectors on plastic substrates by use of printing transferred single-crystal germanium membranes, Applied Physics Letters, vol. 94, No. 013102, Jan. 6, 2009, pp. 1-3.

Mooney et al., Defect-Free Strained Si-on-Insulator Fabricated from Free-Standing Si/SiGe Structures, Abstract—2004 Materials Research Society Spring Meeting, Symposium B High-Mobility Group IV Materials and Devices.

Cohen et al., Defect-Free Strained Si-on-Insulator Structures, Abstract submitted Dec. 1, 2004 for the MAR05 Meeting of the American Physical Society, available on the web in Jan. 2005.

Paskiewicz et al., Defect-Free Single-Crystal SiGe: A New Material from Nanomembrane Strain Engineering, ACS Nano, Jun. 8, 2011.

Tanto, Chapter 6: Suspended Nanomembrane Selective Etching, Dislocation-Free Strain-Engineered Si and SiGe Nanomembranes, Dissertation for the degree of Doctor of Philosophy (Physics) at the University of Wisconsin-Madison, 2009.

Lagally et al., Elastically strain-sharing nanomembranes: flexible and transferable strained silicon and silicon-germanium alloys, J. Phys. D: Appl. Phys., vol. 40, Feb. 2, 2007, pp. R75-R92.

* cited by examiner

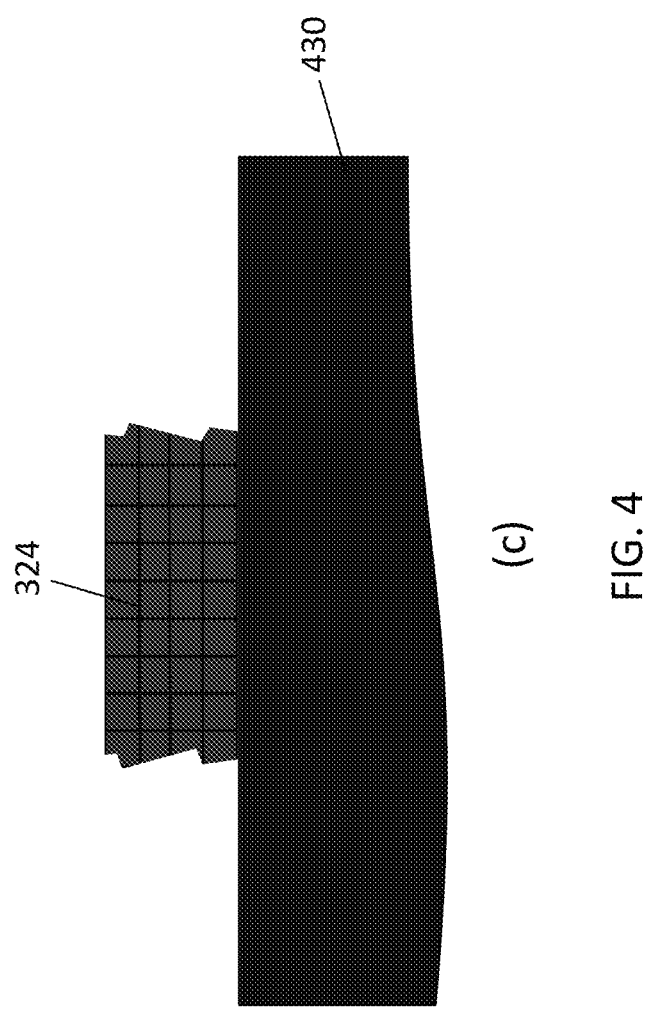

(b)

US 8,492,245 B1

METHODS FOR MAKING THIN LAYERS OF CRYSTALLINE MATERIALS

REFERENCE TO GOVERNMENT RIGHTS

This invention was made with government support under DE-FG02-03ER46028 awarded by Department of Energy. The government has certain rights in the invention.

BACKGROUND

Many electronic and optoelectronic devices are composed of compound semiconductor heterostructures or ferroelectric/multiferroic structures epitaxially grown on single-crystalline growth substrates. Compound semiconductors represent a large class of materials with composition ranges that can, in principle, be varied to provide a broad range of lattice parameters. Provided an appropriate growth substrate is available, such materials can be grown epitaxially using standard film growth techniques. Unfortunately, the number of available single-crystalline growth substrates for such materials is very limited, which has hindered the development of devices based on compound semiconductors having tailored lattice parameters.

SUMMARY

Methods for fabricating a layer of strain-relaxed, single-crystalline material are provided. The methods comprise growing a layer of coherently strained single-crystalline material over a layer of sacrificial material. The layer of sacrificial material has one or more suspended sections and one or more supported sections, wherein the strain in the portions of single-crystalline material grown over the one or more suspended sections is lower than the strain in the portions of single-crystalline material grown over the one or more supported sections. The one or more suspended sections in the layer of sacrificial material can be formed over apertures in a base substrate underlying the layer of sacrificial material. The methods further comprise selectively removing the one or more suspended sections of the layer of sacrificial material, such that the portions of the single-crystalline material previously disposed over the one or more suspended sections are elastically relaxed. Once the elastically relaxed portions are formed, they can be detached from the remainder of the layer of single-crystalline material.

The resulting detached portions of material can be used as epitaxial growth templates for other materials. Therefore, in some embodiments, the methods comprise growing an additional layer of single-crystalline material on the one or more growth templates provided by the detached portions of the first single-crystalline material. The additional layer of single-crystalline material can have the same material composition (and therefore the same lattice constant) as the single-crystalline material of growth template or a different material composition (and different lattice constant) than the single-crystalline material of the growth template.

The methods are well-suited for the fabrication of growth templates made of compound semiconductor alloys or ferroelectric/multiferroic materials.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
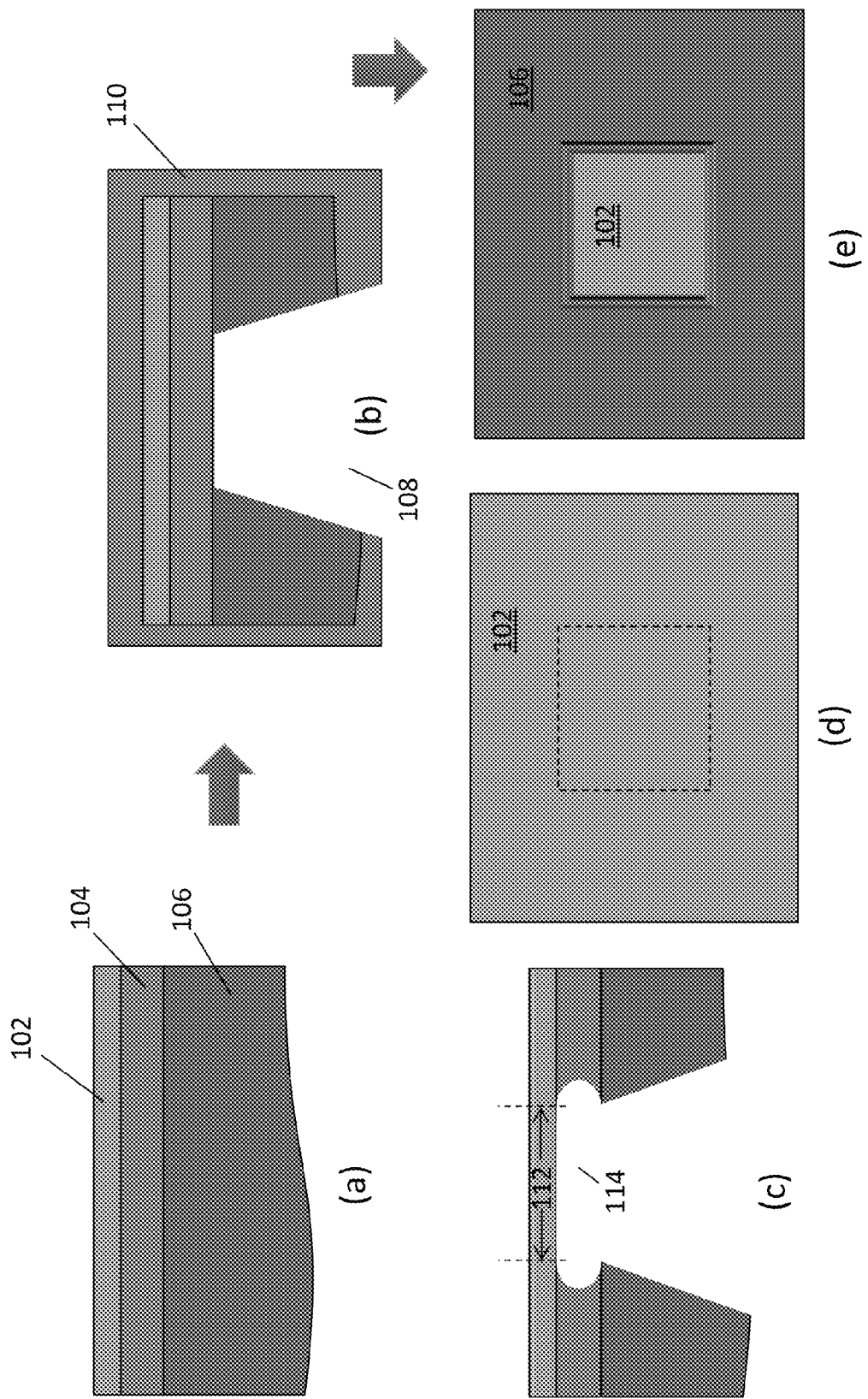
FIG. 1 is a schematic diagram showing one embodiment of a method for fabricating a substrate upon which a growth template layer can be grown.

Methods for making growth templates for the epitaxial growth of compound semiconductors, other alloys, and compounds are provided. The growth templates are thin layers of single-crystalline material that are themselves grown epitaxially on a substrate that includes a thin layer of single-crystalline sacrificial material. The thin layer of single-crystalline sacrificial material, which creates a coherent strain in the single-crystalline material grown thereon, includes one or more suspended sections and one or more supported sections. After the strained layer of single-crystalline material (i.e., the strained growth template layer) has been grown over the layer of sacrificial material, the one or more suspended sections of the sacrificial material are selectively removed, whereby the portions of the layer previously disposed over the suspended sections of the sacrificial material undergo elastic relaxation. The resulting elastically relaxed portions of the single-crystalline material layer are then detached from the remaining portions of the layer to provide one or more growth templates.

The substrates upon which the single-crystalline growth template layers are grown can be multilayered substrates that include a base substrate material underlying the supported sections of the layer of sacrificial material. This base substrate material behaves as a bulk material and restricts the ability of the sacrificial material in the supported sections to share strain with the single-crystalline material that is epitaxially grown thereon. In contrast, in the absence of the underlying base substrate material, the thin, suspended sections of the layer of sacrificial material are better able to share strain with the overlying layer of single-crystalline material. As a result, those portions of the growth template layer that are grown over the suspended sections of the layer of sacrificial material have a lower strain than the portions of the growth template layer that are grown over the supported sections of sacrificial material. The strain sharing between the suspended sections of the sacrificial material and the single-crystalline material grown thereon is advantageous because it increases the thickness at which misfit dislocations begin to form in the single-crystalline material. This makes it possible to fabricate thicker growth templates relative to a fabrication scheme in which the single-crystalline material layer is grown over a thicker (e.g., bulk), rigid substrate with which it undergoes little or no strain sharing.

For the purposes of this disclosure, a multilayered substrate, as described above, can be a substrate wherein the sacrificial material of the sacrificial layer is different from the base substrate material (or base substrate materials). A semiconductor-on-insulator substrate provides one such multilayered substrate, as discussed in greater detail, below. However, a multilayered substrate can also refer to a substrate made of a single material, wherein the topmost layer of the material is defined by a thin, continuous layer of the material and a lower layer of the material is defined by a thicker layer of the same material having one or more holes etched therein (i.e., a non-continuous layer).

FIG. 1 is a schematic diagram showing one embodiment of a method for fabricating a substrate upon which a single-crystalline growth template layer can be grown. Panel (a) of FIG. 1 shows a cross-sectional view of a multilayered substrate that can be used as a starting material. In this case, the multilayered substrate is a semiconductor-on-insulator substrate, such as silicon-on-insulator (SOI), that includes an upper layer of single-crystalline semiconductor (e.g., Si) 102, which serves as a sacrificial layer during the fabrication of the growth template layer. A thin buried oxide layer (e.g., $SiO_2$) 104 is disposed below the upper layer and a handle layer (e.g., Si) 106 is disposed below the buried oxide layer. By way of illustration only, typical thickness ranges for sacrificial layer 102 and oxide layer 104 are from about 10 nm to about 3 nm and from about 150 nm to about 3 nm, respectively. Panels (b) and (c) in FIG. 1 show the fabrication of unsupported sections in sacrificial layer 102. In this step one or more holes 108 are patterned and selectively etched through handle layer 106. For a silicon handle layer, suitable etchants include potassium hydroxide (KOH) and tetramethylammonium hydroxide (TMAH). During this etching step, the sacrificial layer can be protected by a coating of etchant resistant material 110, such as $SiO_2$ or $SiN_x$, deposited on the outer surface of the substrate structure. As shown in panel (c), once a hole has been made in handle layer 106, a second etching step can be used to etch through buried oxide layer 104. This leaves a portion 112 of sacrificial layer 102 over the resulting hole 114 suspended, while the remainder of sacrificial layer 102 remains attached to and supported by buried oxide layer 104. Panels (d) and (e) show top and bottom views, respectively, of the resulting structure. In the top view, the location of the hole underlying the sacrificial layer is shown in dashed lines.

Figure 2:
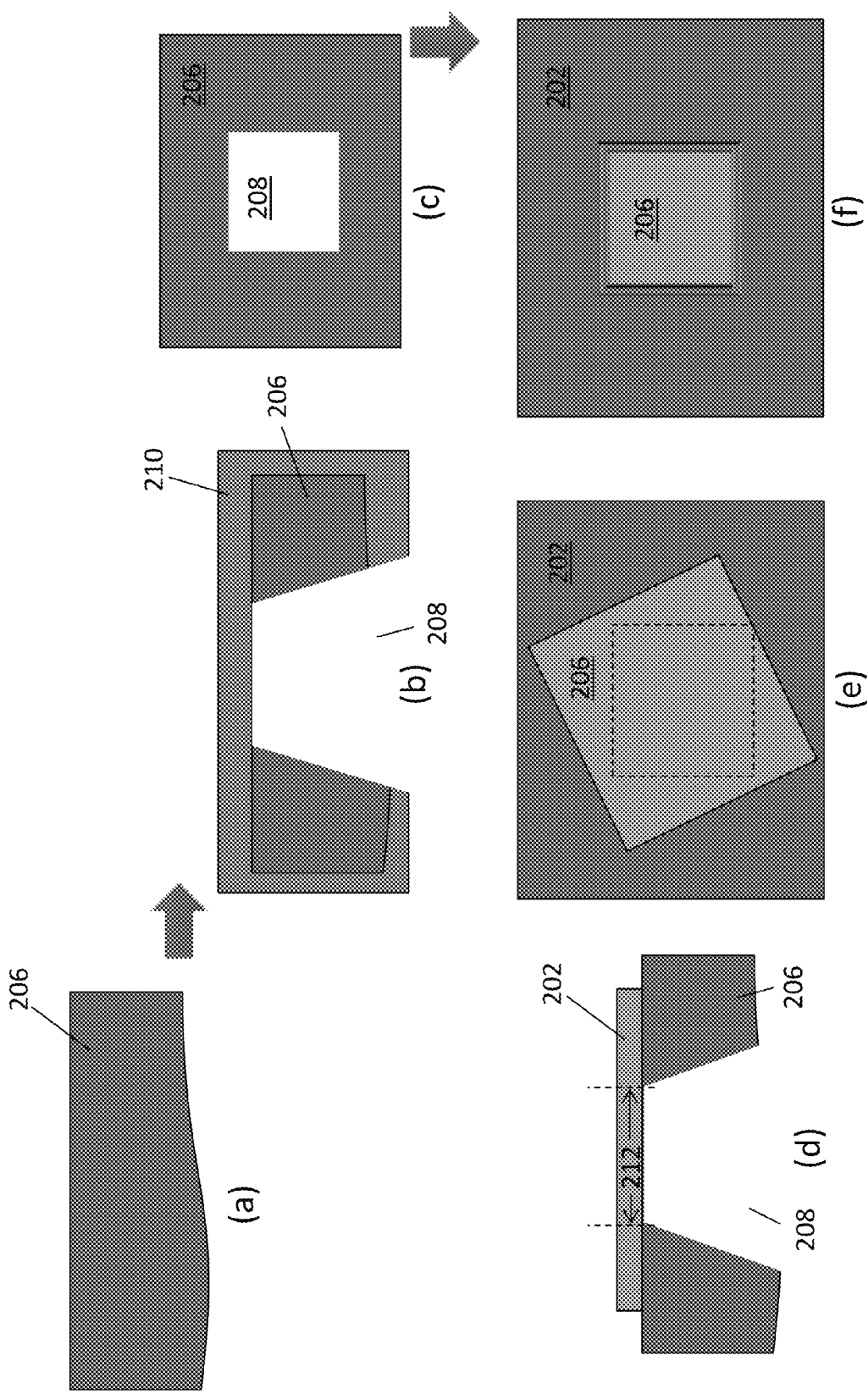
FIG. 2 is a schematic diagram showing another embodiment of a method for fabricating a substrate upon which a growth template layer can be grown.

FIG. 2 is a schematic diagram showing another embodiment of a method for fabricating a substrate upon which a single-crystalline growth template layer can be grown. In this embodiment, the base substrate is a single-layer of material 206, such as silicon, as shown in panel (a). As in the previous embodiment, a hole 208 can be etched through base substrate 206, using an appropriate etchant and etchant-resistant coating 210. Panel (b) shows a cross-sectional side view of the structure with the etchant-resistant coating. Panel (c) shows a top view of the structure after coating 210 has been removed. After one or more holes have been formed through the base substrate 206, a thin layer of sacrificial material 202 can be transferred to the upper surface of the base substrate such that it covers the one or more holes. (Methods for forming, releasing and transferring thin semiconductor layers from one substrate to another are described, for example, in U.S. Pat. No. 7,354,809.) Panels (d)-(f) show side, top and bottom views, respectively, of the resulting two-layered substrate structure, including suspended section 212. Again, in the top view, the location of the hole underlying the sacrificial layer is shown in dashed lines.

Figure 3:
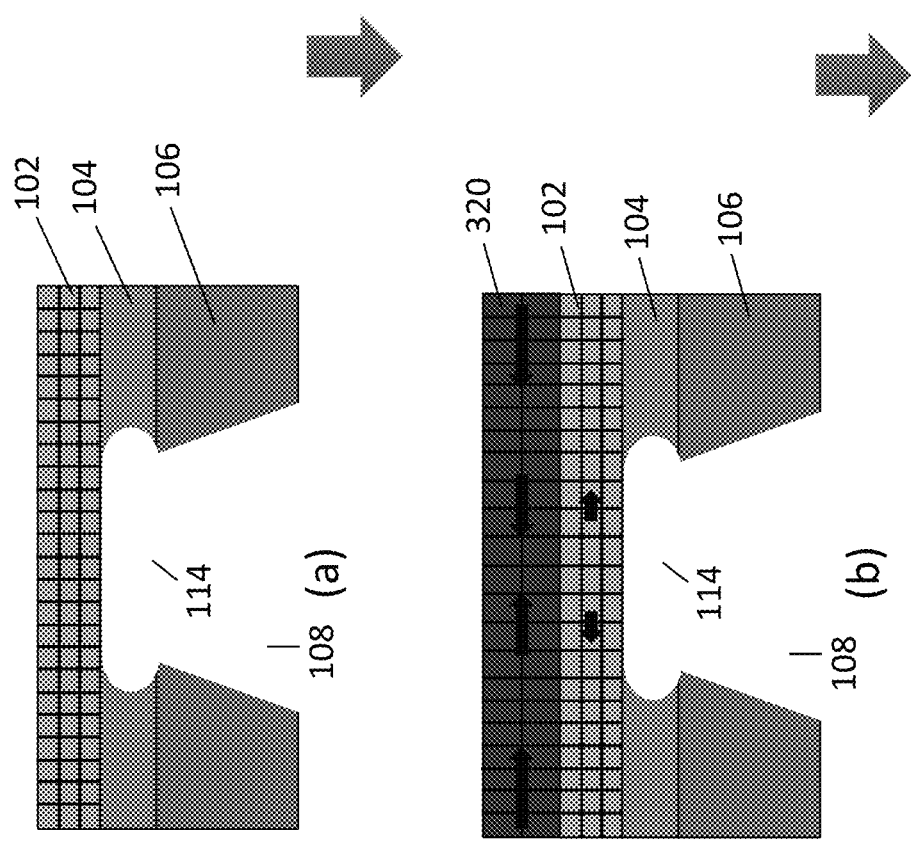
FIG. 3 illustrates a method of forming a growth template layer on the multilayered substrate of FIG. 1.
Figure 3:
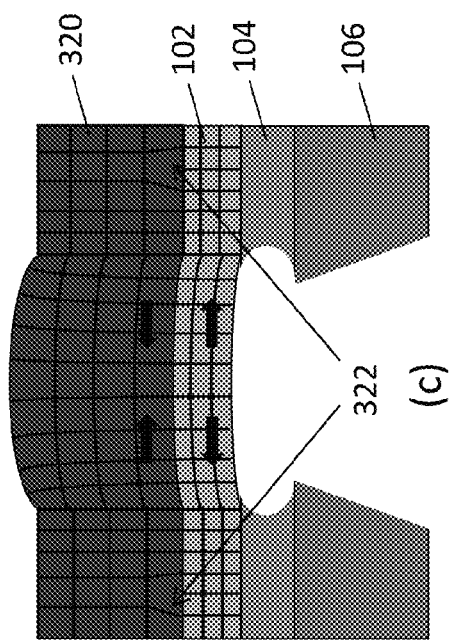
Figure 3:
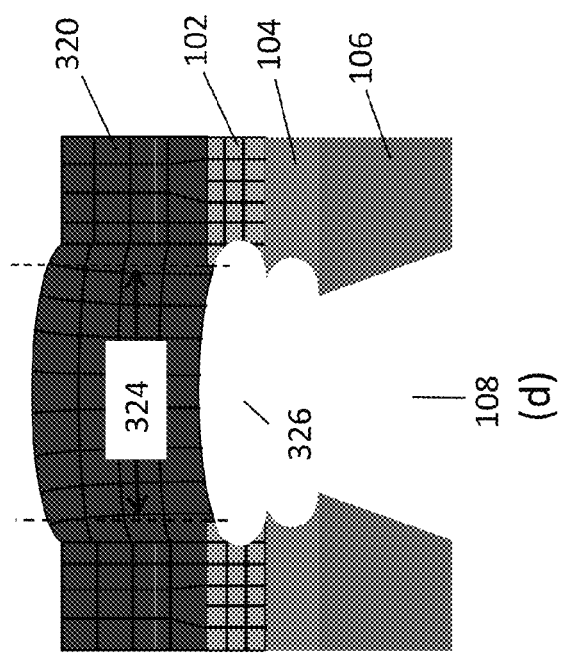

Once the multilayered substrate has been formed, it can be used to grow a layer of the single-crystalline material (the growth template layer). FIG. 3 illustrates a method of forming a single-crystalline material layer on the multilayered substrate of FIG. 1. In this figure, a regular grid pattern is used to represent a single-crystalline, defect-free material. Prior to the growth of the single-crystalline material, the suspended section 112 of sacrificial layer 102 can be strain-free. However, as the material 320 is grown epitaxially on sacrificial layer 102, a strain is created in the sacrificial material. For example, when $Si_{1-x}Ge_x$ alloy is grown on Si, the larger lattice constant of the SiGe alloy creates a tensile strain in the Si and a compressive strain in the SiGe. However, because the suspended sections of the Si sacrificial layer are thin and unsupported, those sections are able to share elastic strain with the SiGe layer to a much greater extent than the supported sections of the sacrificial layer. As a result, the SiGe grown on the suspended section (or sections) of the sacrificial layer has less compressive strain than the SiGe grown on the supported section (or sections). The relative directions and magnitudes of the tensile and compressive strains experienced within the single-crystalline growth template layer and the sacrificial layer are represented by arrows in panel (b) of FIG. 3.

Initially, the single-crystalline growth template layer may be grown to a thickness below the critical thickness for plastic relaxation for the same material, grown using the same growth conditions, on a rigid bulk substrate having the same material composition as the sacrificial layer. However, it is advantageous to grow the layer of single-crystalline material to a dislocation-free thickness greater than which could be achieved on a rigid, bulk substrate, because thicker growth templates are less delicate and easier to handle. The present methods make thicker, defect-free growth possible in those portions of the single-crystalline material layer grown over the suspended sections of the sacrificial layer. As shown in panel (c) of FIG. 3, as the thickness of the growth template layer exceeds the critical thickness, it undergoes plastic relaxation causing misfit dislocations 322 (shown as slanted lines in the grid) to form in material 320 disposed above the supported sections of sacrificial layer 102. However, the suspended sections of the sacrificial layer will continue to share strain elastically with the overlying single-crystalline material. This strain sharing can cause the suspended parts of the bilayer (e.g., Si/SiGe) to expand and bow, as shown in panel (c), but, because the bilayer is pinned by the surrounding supported sections of the sacrificial layer, it cannot curl. The strain sharing allows for thicker, misfit dislocation-free growth. One advantage of this aspect of the present methods is that it allows for the growth of defect-free layers of even highly strained alloys (e.g., $Si_{1-x}Ge_x$ having a high Ge content) at thicknesses that could not be achieved via growth directly on a bulk or fully supported substrate.

In some embodiments, the composition of the single-crystalline material and the growth parameters, including growth temperature and deposition rate, can be controlled such that a dislocation-free layer of the single-crystalline material is grown to a thickness greater than its equilibrium critical thickness through the formation of metastable layers of the material. The thickness at which dislocations begin to form in this metastable structure is referred to as the kinetic critical thickness of the material.

Once the single-crystalline growth template layer 320 has been grown to the desired thickness, the suspended section of sacrificial layer 102 can be etched away leaving a suspended portion 324 in growth template layer 320 disposed above a hole 326, as shown in panel (d) of FIG. 3. In the case of a Si sacrificial layer and a SiGe growth template layer, the etchants KOH and TMAH will etch the Si much faster than the SiGe. Therefore, no protective layer is needed because the etchant will take a long time to undercut the Si supporting the supported portions of the SiGe alloy layer. Once the suspended section of the sacrificial layer is removed, the material that was previously located above that section can elastically relax, adopting the lattice constant of the bulk single-crystalline material. This relaxation may be accompanied by expansion of the suspended portion of the single-crystalline material, which can make that portion wrinkle or bow further.

Figure 4:
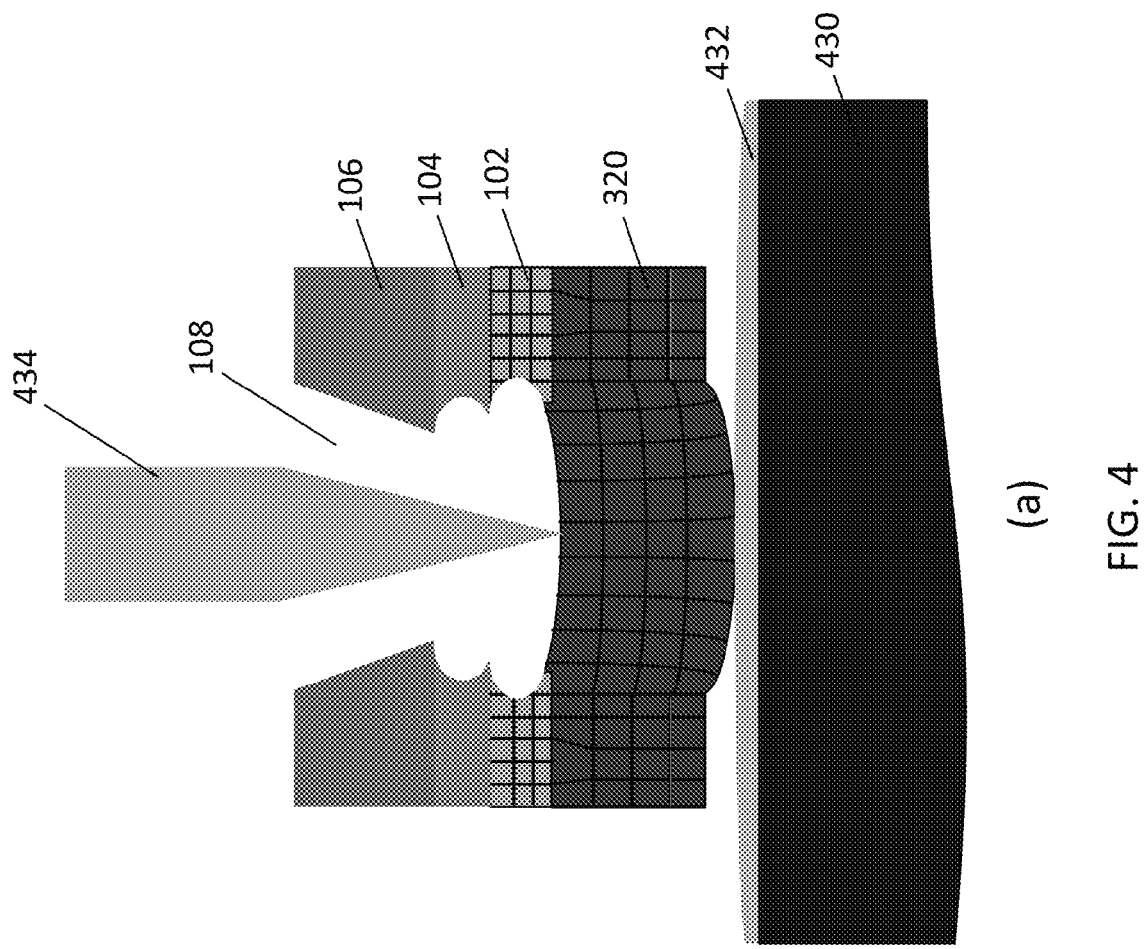
FIG. 4 illustrates a method for detaching the elastically relaxed portions of a single-crystalline growth template layer from the remainder of the layer of single-crystalline material.
Figure 4:
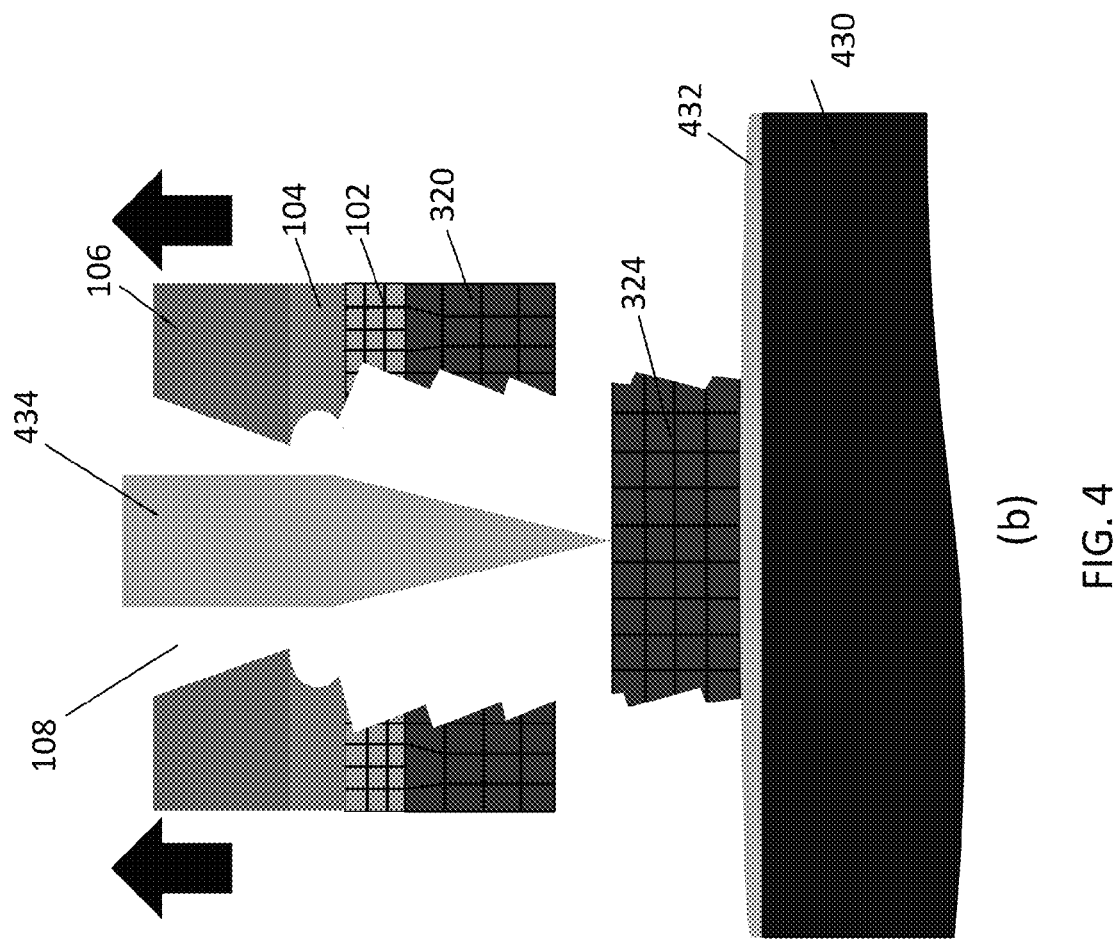

FIG. 4 illustrates a method for detaching the elastically relaxed portions of the single-crystalline growth template layer from the remainder of the single-crystalline material layer. In this method, the structure, including the multilayered substrate and the growth template layer are flipped such that the underside of the suspended portion of the growth template layer is exposed through the etched hole in the substrate and the opposite side is placed in contact with a new host substrate 430 or "bonding substrate", as shown in panel (a). Host substrate 430 may be coated with a liquid film, such as a water or organic solvent film, 432 in order to increase the adhesion between the growth template material and the bonding substrate. Detachment can be achieved by inserting a shaft 434 through the hole such that it applies pressure to the elastically relaxed portion of the growth template layer and forces the elastically relaxed portion of that layer into contact with the underlying bonding substrate. While this pressure is maintained, the layer of growth template material is pulled away from the bonding substrate causing the elastically relaxed portion 324 of that layer to detach from the remainder (i.e., the supported portion) of the layer, as shown in panel (b) of FIG. 4. Heating the bonding substrate causes the liquid coating to evaporate and strengthens the bond between the detached portion of the single-crystalline material and the bonding substrate, as shown in panel (c). This can be accomplished by slowly increasing the heat from room temperature to the desired annealing temperature in an oven or on a hot plate.

Once the detached portion of the single-crystalline growth template layer is bonded to the new bonding substrate, it is ready for use as a growth template for the epitaxial growth of a lattice matched or a lattice mismatched (strained) material. For example, the growth template can be used to epitaxially grow more of the same material or can be used to grow a different material. If a different material is grown, that material may have the same lattice constant or, more likely, a different lattice constant than the material of the growth template. In the latter case, the newly-grown material may be grown with a tensile or a compressive strain, depending on the relative lattice mismatch. Epitaxial growth techniques that can be employed include chemical vapor deposition, molecular beam epitaxy, and liquid phase epitaxy.

Figure 5:
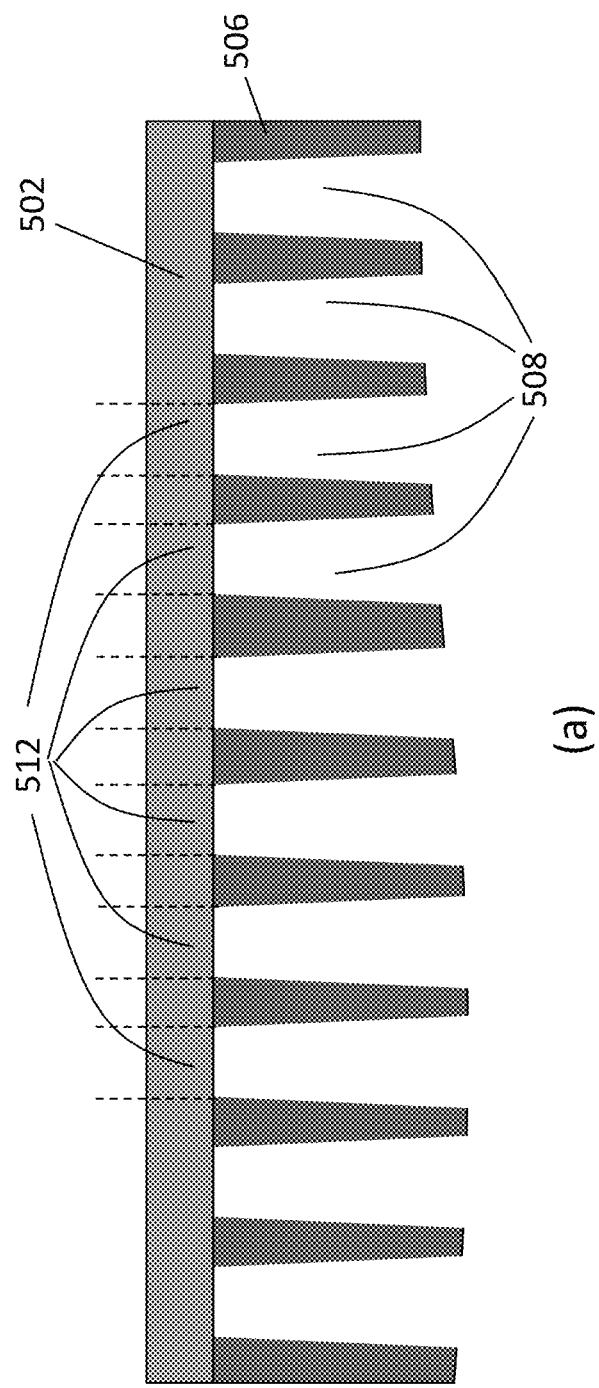
FIG. 5 is a schematic diagram of a multilayered, wafer-scale substrate that can be used to fabricate an array of growth templates.
Figure 5:
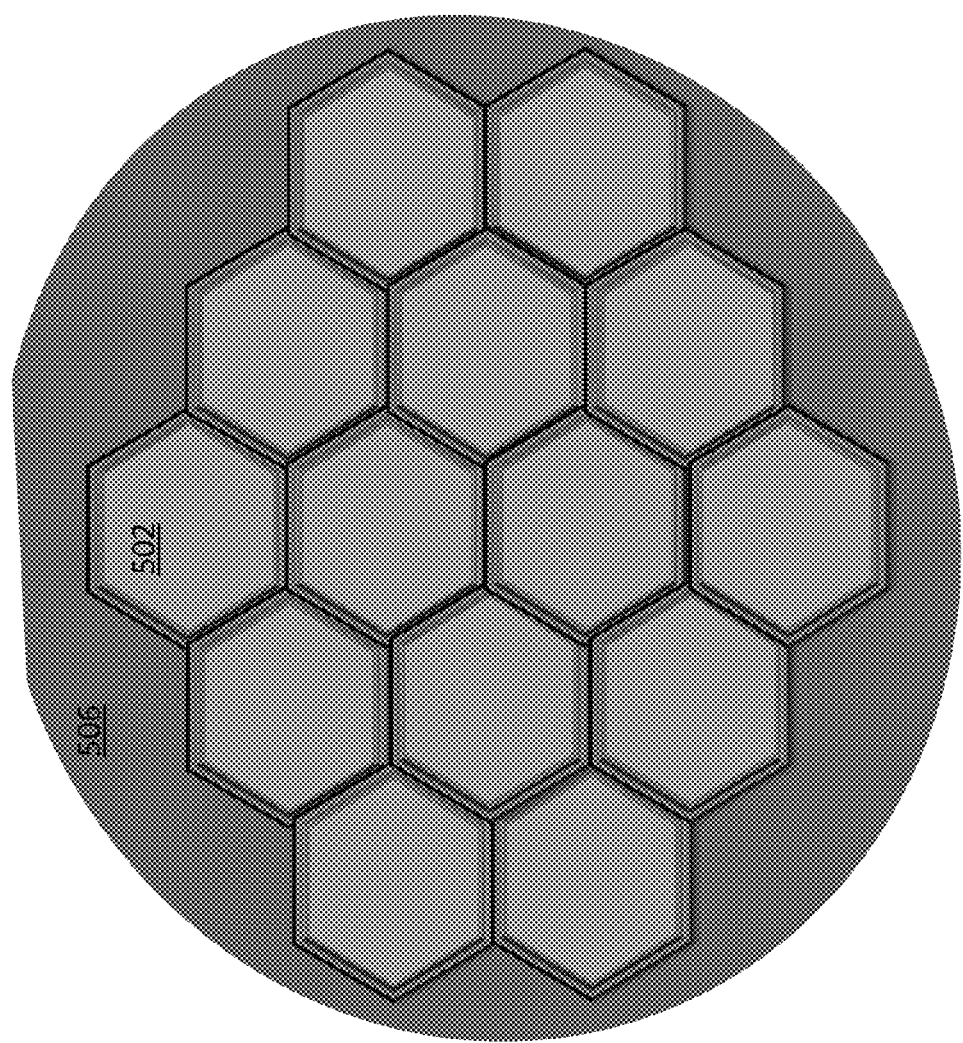
Figure 5:
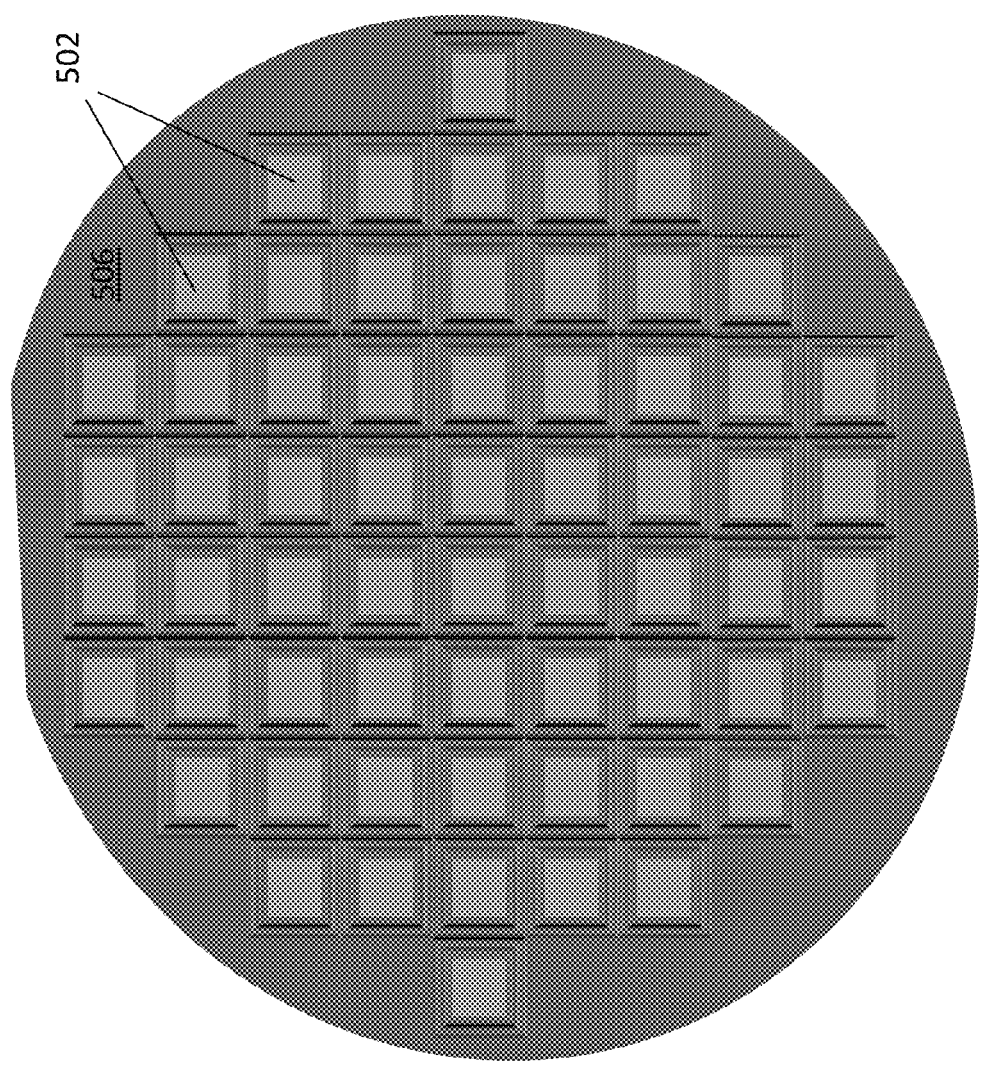

FIGS. 1-4 illustrate the fabrication of a single, detached, elastically relaxed growth template comprising a single-crystalline material. However, the methods can also be used to fabricate arrays of growth templates simply by using a multilayered base substrate having a plurality of suspended sections in the sacrificial layer. By growing a continuous layer of single-crystalline material over the plurality of suspended sections, removing the plurality of suspended sections from the layer of sacrificial material, and detaching the resulting plurality of elastically relaxed portions of single-crystalline material from the layer of single-crystalline material, arrays of growth templates can be made. FIG. 5 is a schematic diagram of a multilayered substrate that can be used to fabricate an array of growth templates. Panel (a) is a cross-sectional view of the substrate showing a sacrificial layer 502 that includes a plurality of suspended sections 512. Sacrificial layer 502 is disposed over a base substrate layer 506 through which a plurality of holes 508 has been etched. The holes in the base substrate material can be formed in a variety of shapes and sizes. Panels (b) and (c) in FIG. 5 show the bottom views of an array of hexagonal holes and an array of square holes, respectively. The elastically relaxed growth templates made from these substrates would be laid out in the same array pattern and have similar sizes and shapes as the holes. Arrays such as these can be made over large areas, including wafer-scale areas. Thus, the arrays can cover areas of at least 20 mm², at least 50 mm², at least 100 mm², at least 200 mm², at least 300 mm², or greater.

The present methods can be used to fabricate epitaxial growth templates from a variety of materials, including alloys comprising semiconductor elements, alloys comprising metal oxides, ceramic alloys, and compounds, such as metal oxides. Semiconductor alloys that can be used as epitaxial growth templates include binary, ternary, and quaternary semiconductor alloys. Examples of these include Group IV-IV, Group III-V, and Group II-VI semiconductor alloys. Specific examples of these include $Si_{1-x}Ge_x$ ($0 \leq x \leq 1$), $In_xGa_{1-x}P$, $In_xGa_{1-x}As$, and $In_xAl_{1-x}As$ ($0 \leq x \leq 1$). The composition of the semiconductor alloy to be used as an epitaxial-growth template can be tailored to provide a desired lattice constant. Because the present methods allow for misfit dislocation-free growth to thicknesses greater than the critical thickness for plastic relaxation on bulk or rigid substrates, growth templates comprising highly strained alloys can be fabricated. For example growth templates of $Si_{1-x}Ge_x$ can be fabricated with x values of at least 0.4, at least 0.5, at least 0.6, or at least 0.8.

Metal oxides, including transition metal oxides, ferroelectric-oxides and multiferroic alloys are other classes of materials for which growth templates can be made using the present methods. Included among these are metal oxides having a perovskite structure. Specific examples of metal oxides that can be fabricated as growth templates include $SrTiO_3$ (STO), $LaTiO_3$, $PbZr_{1-x}Ti_xO_3$ (PZT), $BaTiO_3$ (BTO), $Ba_{1-x}Sr_xTiO_3$ (BST), $LiNbO_3$, $KTaO_3$ and $La_{0.7}Sr_{0.3}MnO_3$ (LSMO).

The thickness of the growth template layers grown according to the present methods will depend on the lattice mismatch between the growth template material and the sacrificial material, as well as on the thickness of the suspended sections of the sacrificial layer upon which they are grown and the rate of growth and growth conditions. By way of illustration only, in some embodiments, the growth template layers are grown to a thickness of at least 10 nm. This includes growth template layers grown to a thickness of at least 40 nm, at least 100 nm and at least 1 μm.

Depending on the lattice constant differences between the growth template material and the sacrificial material, dislocations may begin to appear at higher thicknesses of the growth template material. Therefore, by selecting appropriate material compositions for the growth template layer and the sacrificial layer, the present methods can be used to provide device layers for applications where relatively large thicknesses are desirable, including optical, photonic, and thermoelectric applications.

The material used as a sacrificial layer during the production of the growth template layers can be any material upon which the growth template layers can be grown epitaxially and that can be selectively removed from the structure once the growth template layer has been grown to the desired thickness. For example, Si can be used as the sacrificial layer for a SiGe alloy growth template. GaAs can be used as the sacrificial layer for an InGaP or InGaAs alloy growth template. $SrTiO_3$ can be used as the sacrificial layer for a PZT or BST growth template The sacrificial layer should be sufficiently thin, at least in the suspended sections, to allow it to strain share with the overlying single-crystalline material. Thus, in some embodiments the sacrificial layer has a thickness of no greater than about 5 μm. This includes embodiments in which the sacrificial layer has a thickness of no greater than about 3 μm. For example, the thickness of the suspended sections of the sacrificial layer can be in the range from about 10 nm to about 3 μm.

The material used as a base substrate material during the production of the growth templates can be any material upon which the layer of sacrificial material can be grown or to which the layer of sacrificial material can be bonded. Typically, the base material is substantially thicker than the sacrificial layer having a thickness of, for example 100 μm or greater (e.g., 200 to 1000 μm).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for fabricating a layer of strain-relaxed, single-crystalline material, the method comprising:
    growing a layer of coherently strained single-crystalline material over a layer of sacrificial material, the layer of sacrificial material comprising one or more suspended sections and one or more supported sections, wherein the strain in the portions of single-crystalline material grown over the one or more suspended sections is lower than the strain in the portions of single-crystalline material grown over the one or more supported sections;
    selectively removing the one or more suspended sections of the layer of sacrificial material, such that the portions of the single-crystalline material previously disposed over the one or more suspended sections are elastically relaxed; and
    detaching the one or more elastically relaxed portions of the layer of single-crystalline material from the remainder of the layer of single-crystalline material.

2. The method of claim 1, wherein the one or more suspended sections in the layer of sacrificial material are formed over apertures in a base substrate underlying the layer of sacrificial material.

3. The method of claim 2, wherein the layer of coherently strained single-crystalline material is grown on a silicon-on-insulator substrate comprising a layer of single-crystalline Si disposed over a buried oxide layer supported on a handle wafer, and further wherein the layer of single-crystalline Si is the sacrificial layer and the buried oxide layer and the handle wafer together form the base substrate.

4. The method of claim 2, wherein the layer of coherently strained, single-crystalline material has a thickness in the range from 10 nm to 3 nm, the layer of sacrificial material has a thickness in the range from 10 nm to 3 μm and the base substrate has a thickness of at least 100 nm.

5. The method of claim 1, wherein the coherently strained single-crystalline material is grown to a thickness greater than the critical thickness for plastic relaxation for the single-crystalline material grown on a substrate of bulk sacrificial material.

6. The method of claim 5, wherein the detached portions of the layer of single-crystalline material are free of misfit dislocations.

7. The method of claim 1, wherein the layer of sacrificial material has a plurality of suspended sections and the layer of single-crystalline material is grown as a continuous layer over the plurality of suspended sections.

8. The method of claim 7, wherein the plurality of suspended sections of the layer of sacrificial material is formed over apertures in a base substrate underlying the layer of sacrificial material.

9. The method of claim 1, further comprising bonding the one or more detached portions of the single-crystalline material to a bonding substrate.

10. The method of claim 1, wherein detaching the one or more elastically relaxed portions of the layer of single-crystalline material from the remainder of the layer of single-crystalline material comprises:
    contacting a surface of the one or more elastically relaxed portions of the single-crystalline material with a bonding substrate;
    applying a pressure to an opposite surface of the one or more elastically relaxed portions of the layer of single-crystalline material to maintain the contact between the one or more elastically relaxed portions of the layer of single-crystalline material and the bonding substrate; and
    pulling the remainder of the layer of single-crystalline material away from the bonding substrate, such that the elastically relaxed portions of the layer of single-crystalline material detach from the remainder of the layer of single-crystalline material.

11. The method of claim 10, wherein the surface of the bonding substrate is coated with a liquid, the method further comprising evaporating the liquid coating from the surface of the bonding substrate.

12. The method of claim 1, further comprising growing an additional layer of single-crystalline material on the one or more elastically relaxed, detached portions.

13. The method of claim 12, wherein the additional layer of single-crystalline material has the same material composition as the material of the detached portions.

14. The method of claim 12, wherein the additional layer of single-crystalline material has a different material composition than the material of the detached portions.

15. The method of claim 1, wherein the single-crystalline material is a single-crystalline semiconductor alloy.

16. The method of claim 15, wherein the semiconductor alloy is $Si_{1-x}Ge_x$ and x is at least 0.2.

17. The method of claim 1, wherein the single-crystalline material is a transition metal oxide.

18. The method of claim 1, wherein the layer of coherently strained, single-crystalline material has a thickness in the range from 10 nm to 3 μm and the layer of sacrificial material has a thickness in the range from 10 nm to 3 nm.

* * * * *

UNITED STATES PATENT AND TRADEMARK OFFICE
CERTIFICATE OF CORRECTION

PATENT NO. : 8,492,245 B1
APPLICATION NO. : 13/367600
DATED : July 23, 2013
INVENTOR(S) : Max G. Lagally et al.

It is certified that error appears in the above-identified patent and that said Letters Patent is hereby corrected as shown below:

IN THE SPECIFICATION

Col. 3; line 18

Delete the phrase "10 nm to about 3 nm" and replace with the phrase --10 nm to about 3 μm--

Col. 3; line 19

Delete the phrase "150 nm to about 3 nm" and replace with the phrase --150 nm to about 3 μm--

IN THE CLAIMS

Col. 7; line 64 (claim 4)

Delete the phrase "10 nm to 3 nm" and replace with the phrase --10 nm to 3μm --

Col. 8; line 2 (claim 4)

Delete "100 nm" and replace with --100 μm--

Col. 8; line 62 (claim 18)

Delete the phrase "10 nm to 3 nm" and replace with the phrase --10 nm to 3 μm--

Signed and Sealed this
Fifteenth Day of April, 2014

Michelle K. Lee
*Deputy Director of the United States Patent and Trademark Office*